(12) United States Patent
Takigawa et al.

(10) Patent No.: US 6,278,192 B1
(45) Date of Patent: Aug. 21, 2001

(54) SEMICONDUCTOR DEVICE WITH ENCAPSULATING MATERIAL COMPOSED OF SILICA

(75) Inventors: Yukio Takigawa; Ei Yano, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/354,734

(22) Filed: Jul. 16, 1999

(30) Foreign Application Priority Data

Jul. 17, 1998 (JP) ................................... 10-203451

(51) Int. Cl.[7] .................................................. H01L 21/50
(52) U.S. Cl. .......................... 257/787; 257/737; 257/738; 257/673; 257/780; 348/106; 348/107; 348/460; 348/612
(58) Field of Search ..................... 257/737, 738, 257/673, 780, 787; 438/107, 106, 460, 612

(56) References Cited

U.S. PATENT DOCUMENTS 5,357,673 * 10/1994 Polak et al. ............................. 29/840
6,063,646 * 5/2000 Okuno et al. ......................... 438/107

FOREIGN PATENT DOCUMENTS 0 978 542 A1    2/1990  (EP) .

* cited by examiner

Primary Examiner—Fetsum Abraham
(74) Attorney, Agent, or Firm—Armstrong, Westerman, Hattori, McLeland & Naughton, LLP

(57) ABSTRACT

A semiconductor device having enhanced reliability which is obtained by cutting a wafer encapsulated by an encapsulating material layer in such a manner that each of end faces of bumps for an external terminal is exposed, and a method of isolating a metal in an encapsulating material to allow measuring. The semiconductor device comprises a semiconductor element, bumps formed on a surface thereof for external terminals, and an encapsulating material layer, the encapsulating material layer being formed of an encapsulating material containing greater than 70% by weight and not greater than 90% by weight of fused silica, based on the total weight of the encapsulating material. The metal in the encapsulating material comprising a resin component and a fumed silica filler is isolated for measuring by adding the encapsulating material to a solvent capable of dissolving the resin component, separating solvent-insolubles from the solution in which the resin component has been dissolved, introducing the insolubles into a liquid having a specific gravity of 2.5 to 5.5 to disperse the insolubles, and then recovering the precipitate.

25 Claims, 2 Drawing Sheets

SEMICONDUCTOR DEVICE WITH ENCAPSULATING MATERIAL COMPOSED OF SILICA

BACKGROUND OF THE INVENTION

1. Field of the Invention

The invention relates to semiconductor devices which are obtained by cutting a wafer encapsulated by an encapsulating material layer in such a manner that each of end faces of bumps for an external terminal is exposed, into individual elemental devices, and to a method of the manufacture thereof.

2. Description of the Related Art

Recent trends of downsizing and miniaturization of electronic equipment are accompanied by development of miniaturized and thinner semiconductor devices having a higher quality. Prior semiconductor devices used a semiconductor functional element and a lead frame and, in such a device, areas other than sites required for the device to be mounted on a print substrate were encapsulated to be coated by an encapsulating material for the purpose of protection against an external environment. Accordingly, development for miniaturization of semiconductor devices was mainly directed to lead frames, which act as a substrate, and encapsulating materials. As a result, TSOPS (thin small outline packages) which have a smaller capacity of encapsulating material and are thinned, QFPs (quad flat packages) which cope with a larger number of pins, etc. have been developed.

A semiconductor device having a lead frame and a larger number of pins has a larger package size, and is more difficult to mount since the outer leads have a smaller pitch. Packages of BGA (ball grid array) type and chip size packages (CSPs), which have been recently developed, are semiconductor devices having the above problems solved. By way of example, the chip size packages include those obtained by, for example, encapsulating a wafer provided on a surface with bumps for external terminals for each functional element (chip) in such a manner that each of end faces of bumps is exposed, and subsequently cutting the wafer into individual chips.

For the encapsulation of semiconductor devices, since a transfer molding using an encapsulating material based on an encapsulating resin component is employed, whereby an outer shape of a semiconductor device is formed by filling the encapsulating material into a mold containing the semiconductor device, mold releasability of an encapsulating material has been an important requirement. Also, there have been problems such that if adhesion between an encapsulating material and a semiconductor functional element or a lead frame is poor, debonding is caused between them, and a debonded portion is prone to be subjected to invasion by external water, to thereby accelerate corrosion of wirings and pads on the functional element, or cause package cracks due to gasification of water during reflowing for mounting of a chip. For an encapsulating material, however, mold releasability during molding and adhesion for protection of a semiconductor functional element are conflicting characteristics, and hitherto, an optimum point has been found by balancing the both. Also, selection, as a material for a semiconductor functional element, of a passivation material such as a polyimide coating material has taken place, or development for better adhesion to an encapsulating material by, for example, making the surface of a lead frame uneven, has been carried out. Nevertheless, in semiconductor devices using a prior encapsulating material it is difficult to make adhesion and mold releasability compatible with each other, and no semiconductor devices have been obtained which fully satisfy such objects.

On the other hand, it has been required that an internal stress caused by use of different materials is reduced to thereby enhance reliability of a semiconductor device, and this requirement has been possible to be satisfied by harmonizing coefficients of thermal expansion of a semiconductor functional element or lead frame and an encapsulating material with each other to reduce a thermal stress. By means of this, reliability of a semiconductor device has been improved.

As an encapsulating material for semiconductor devices, a composition based on an epoxy resin and comprising an inorganic filler such as alumina, silica or the like is used. In such a composition, particularly when a silica filler is used, the surface of the filler is treated by a silane coupling agent or the like, or a coupling agent is mixed with a resin during kneading of the resin, in order to improve the wettability of the inorganic filler with the resin.

An elevated temperature (for example, 175° C.) is used during encapsulation using a resin based encapsulating material. Consequently, in the case of encapsulation of a larger silicon wafer, a warp of the wafer occurs in the course of cooling to room temperature after the encapsulation due to a difference between shrinkage factors of the silicon wafer and the encapsulating material. This warp is an obstacle when solder balls are provided on bumps for individual elements (chips) or the wafer is cut into individual elements (chips).

The encapsulating material comprising a resin component and an inorganic filler had a restrained amount of added filler of 70% by weight or less in order to control the warp of wafer due to curing and shrinkage of the encapsulating material after the encapsulation of the wafer by molding as referred to above. This is because in the amount of more than 70% by weight, the encapsulating material has a higher Young's modulus and a larger shrinkage stress, and accordingly, the warp increases. Also, this is because there had been a problem of largely reduced workability in a manufacturing process of semiconductor device after encapsulation when the warp of a wafer is increased.

In a chip size package, adhesion between an encapsulating material and a chip is important, and a slight peeling of the encapsulating material noticeably reduces reliability of the package. The encapsulating material has a thickness of 80 to 120 micrometers, and the chip is protected only by the encapsulating material. Accordingly, the encapsulating material is required to have more toughness and mechanical strength than that in a prior semiconductor device having a lead frame. In addition, small voids in a layer of the encapsulating material largely reduce reliability of the package.

It is thought that the voids are generated for the following reasons. When silica powder of an inorganic filler is directly treated in advance by a coupling agent, the silane coupling agent and hydroxyl groups on the surface of the silica give rise to a hydrolysis reaction, and the silane coupling agent and the silica chemically bond to each other, while the surface of silica is coated with the silane coupling agent. As the silane coupling agents used here, the following are enumerated: silane coupling agents of glycidyl type such as gamma-glycidoxypropyltrimethoxysilane and gamma-glycidoxypropyltriethoxysilane, and silane coupling agents of amine type. The reaction of a silane coupling agent with a hydroxyl group on a surface of silica is a dealcohol reaction as shown below:

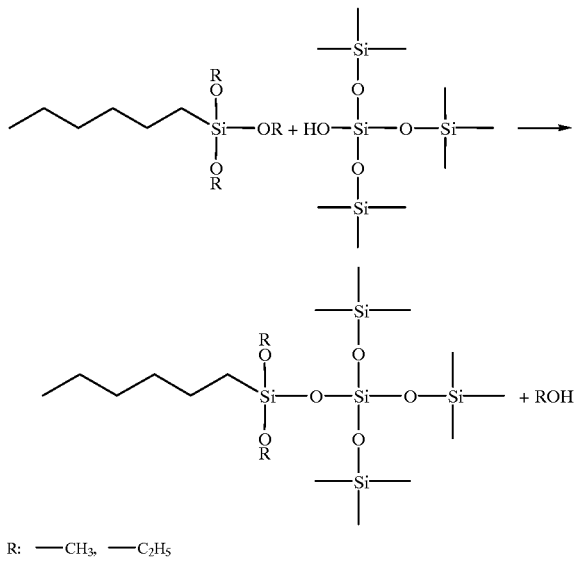

R: —CH₃, —C₂H₅

The alcohol ROH generated by this reaction is released to the atmosphere during the treatment of the filler, and therefore does not remain on the surface of the filler. However, there is a possibility of retention of unreacted silane coupling agent and, in a semiconductor device to which an encapsulating material is applied, the encapsulating material being filled with the filler treated by the silane coupling agent, or obtained by previously adding the coupling agent to a resin component and then mixing the mixture with the filler, the unreacted silane coupling agent in the encapsulating material causes, due to effects of ambient temperature and humidity, a hydrolysis reaction with absorbed water, as shown below, to thereby result in generation of an alcohol.

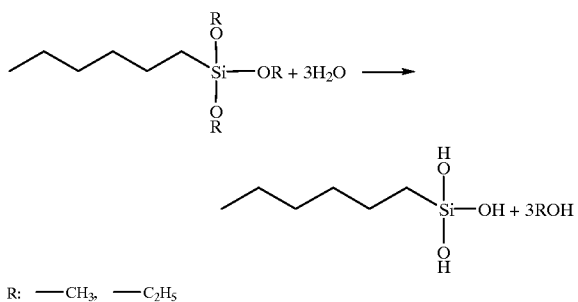

R: —CH₃, —C₂H₅

The alcohol in the encapsulating material is abruptly vaporized and expanded by rapid increase in temperature during a molding operation for encapsulation, and causes voids and cracks to be generated in a cured encapsulating material. This is also true to the time of mounting, and water further intrudes into the voids or cracks, resulting in failure of operation of semiconductor functional element. Further, electrical conductivity of the encapsulating material is temporarily reduced during the proceeding of the hydrolysis reaction of the coupling agent, and accordingly, when unreacted coupling agent remains even after mounting, short-circuits between wiring may occur due to the hydrolysis.

On the other hand, a fused silica, among silica powders, is used, in some cases, as a filler to be used in an encapsulating composition, because of its smaller contents of metals, and sodium and chloride ions. Since few hydroxyl groups are present on the surface of the fused silica, a dealcohol reaction does not take place between the fused silica filler and a silane coupling agent when the filler is treated by a silane coupling agent as stock solution. Accordingly, there has been a problem of a semiconductor device to which an encapsulating material filled with a fused silica filler treated by a coupling agent is applied being subjected to a hydrolysis reaction in the encapsulating material due to effects of ambient temperature and humidity, resulting in occurrence of voids during molding for encapsulation, and reduced reliability of the semiconductor device (reduced adhesive force between the encapsulating material and a silicon substrate, and reduced insulation properties between wirings).

The method of treating a filler by a coupling agent, which has a precondition of hydrolysis reaction with hydroxyl groups on the surface of a filler, has not been capable of being applied to alumina, aluminum nitride, magnesium oxide, silicon nitride, boron nitride and the like which are used as electrically insulating fillers having high thermal conductivities. Accordingly, these fillers could not enjoy a benefit of enhanced properties of the filler by improvement of wettability to a resin component.

In the presence of voids or cracks in a formed layer of encapsulating material, peeling of the encapsulating material layer from a silicon substrate further progresses originating in the voids or cracks due to shock during cutting of a wafer into individual elements.

In addition, in encapsulation of a wafer, it is critical to avoid occurrence of unfilled portions where an encapsulating material does not spread. A wafer having unfilled portions is a reject, resulting in waste. In particular, for wafers of a diameter of 6 to 8 inches (about 15 to 20 centimeters) or more, since formation of unfilled portions leads to waste of a large number of elements at the same time, it is essential to thoroughly cover the wafer so that unfilled portions are not formed.

An encapsulated semiconductor device mounted on a substrate is subjected to a temperature cycle due to on-off operation of the device and change of external temperature after mounting. During that cycle, the substrate for mounting is expanded and shrunk, and the resultant stresses are applied to the semiconductor device. The stress is concentrated particularly in the vicinity of roots of copper bumps in the semiconductor device (joints to the silicon substrate), resulting in failure of bumps, breakage of elements or the like.

For the manufacture of an encapsulating material, melting and kneading of a resin component, and subsequent solidification and grinding are essential, and it is inevitable that metal is incorporated into the encapsulating material from items of equipment used during these processes (a kneader, a crusher, etc.). In prior wire bonding used for bonding of a semiconductor functional element and a lead frame, even when a metal piece having a length of, for example, 34 micrometers is included in an encapsulating material, the included metal piece did not directly lead to a rejected element with respect to a pitch between wirings and a pitch between leads. In a chip size package, however, since a distance between wirings on the surface of an element is 25 to 10 micrometers, a possibility of metal or conductor powder of a length of 34 micrometers or more causing a short-circuit between wirings is drastically increased when such metal or conductor powder is included in an encapsulating material. Therefore, with respect to inclusion of metal or conductor powder in an encapsulating material, it is necessary to strictly control the quantity and the size thereof. A method of isolating a metal in a resin and a method of analysis thereof, which are useful for such control, have not been established to date.

SUMMARY OF THE INVENTION

Thus, in semiconductor devices which are obtained by cutting a wafer encapsulated by an encapsulating material layer in such a manner that each of end faces of bumps for external terminals is exposed, into individual elemental devices, it is important that voids or cracks are absent in the encapsulating material layer, cracks in the encapsulating material layer occurring during mounting of a moisture-absorbed package are absent, peeling of the encapsulating material layer from a silicon substrate due to shock during cutting of a wafer into individual elements is absent, and the semiconductor device is provided with a toughness withstanding a temperature cycle and a sufficient adhesion strength between the silicon substrate and the encapsulating material layer, and is further encapsulated by an encapsulating material layer having a controlled metal content.

Accordingly, an object of the invention is to provide a semiconductor device of high reliability satisfying these requirements. It is also an object of the invention to provide a method of isolating a metal in an encapsulating material for measuring.

The semiconductor device of the invention is a semiconductor device comprising a semiconductor element, bumps formed on a surface thereof for external terminals, and an encapsulating material layer formed in such a manner that it covers the surface of the element on which the bumps are formed and exposes end faces of the bumps, wherein the encapsulating material layer is formed of an encapsulating material containing greater than 70% by weight and not greater than 90% by weight of fused silica, based on the total weight of the encapsulating material.

The method of the invention is a method of isolating a metal contained in an encapsulating material for encapsulating a semiconductor device, the encapsulating material comprising a resin component and a fused silica filler, wherein the method comprises adding the encapsulating material to a solvent capable of dissolving the resin component, separating solvent-insolubles from the solution in which the resin component has been dissolved, introducing the insolubles into a liquid having a specific gravity of 2.5 to 5.5 to disperse the insolublear and then recovering a precipitate.

In another aspect, the invention is a method of isolating a metal contained in an encapsulating material for encapsulating a semiconductor device, the encapsulating material comprising a resin component and a filler, wherein the method comprises adding the encapsulating material to a solvent capable of dissolving the resin component, separating solvent-insolubles from the solution in which the resin component has been dissolved, introducing the insolubles into a liquid having a specific gravity of between a specific gravity of the filler and a specific gravity of the metal to disperse the insolubles, and then recovering a precipitate.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein.

DETAILED DESCRIPTION OF THE INVENTION

Figure 1:
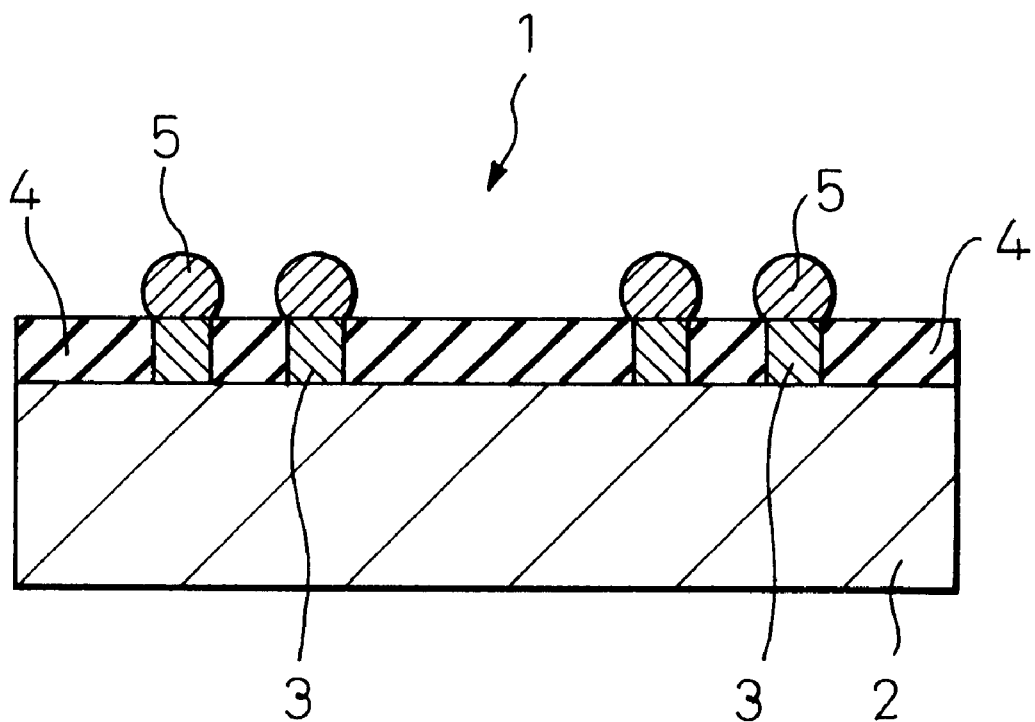
FIG. 1 illustrates a semiconductor device of the invention.
Figure 2A:
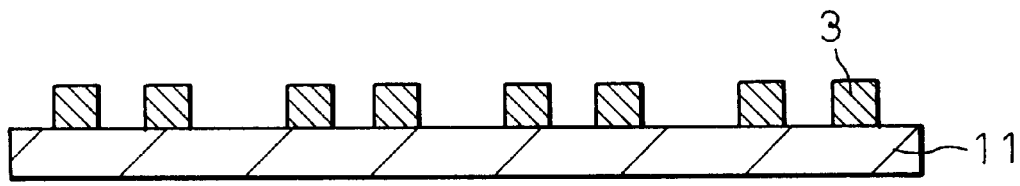
FIGS. 2A to 2D illustrate the manufacture of the semiconductor device of FIG. 1.
Figure 2B:
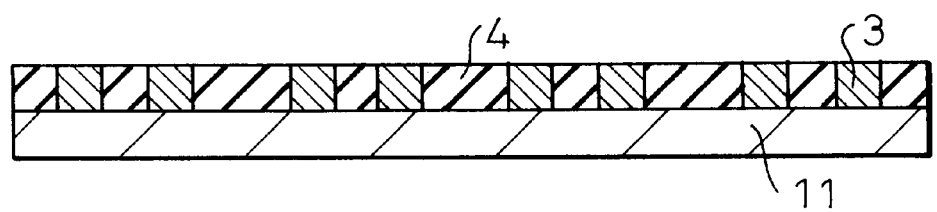
Figure 2C:
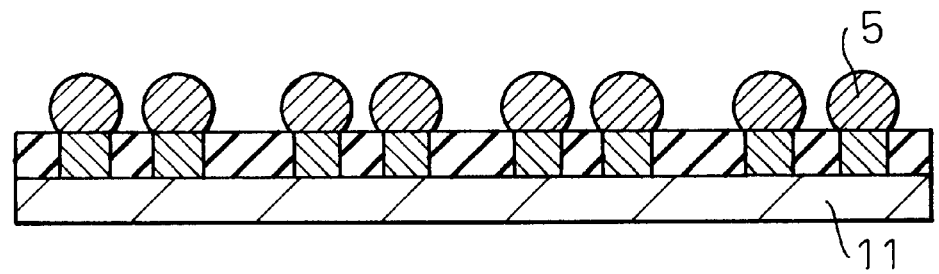
Figure 2D:
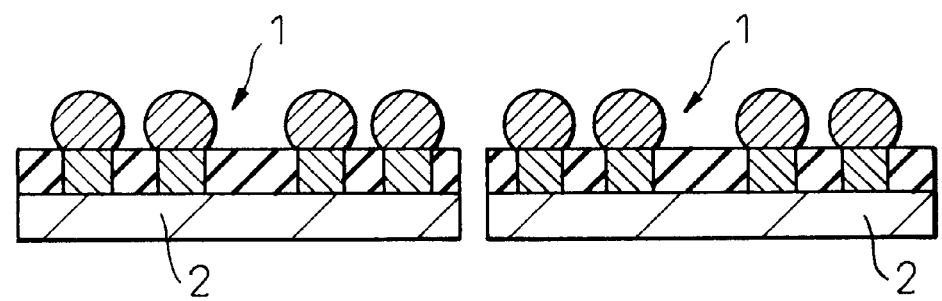

FIG. 1 schematically shows a semiconductor device 1 of the invention. In the semiconductor device 1, bumps 3 for external terminals are formed on a surface of a semiconductor functional element 2 having been subjected to certain micro-fabrication processes, and an encapsulation material layer 4 is formed in such a manner that each of the end faces for external terminal of the bumps 3 is exposed. To mount the semiconductor device 1 on a substrate, a solder ball is provided on each of the exposed end faces of the bumps 3.

Referring to FIG. 2, manufacture of the semiconductor device 1 is described. First, a wafer 11 is subjected to certain micro-fabrication processes for respective elemental regions, and bumps 3 of copper are then formed on a surface of the wafer 11 by plating (FIG. 2A). Subsequently, an encapsulating material layer 4 is formed in such a manner that each of the end faces for external terminal of the bumps 3 is exposed (FIG. 2B). A solder ball 5 is then placed on each of the exposed end faces of the bumps 3 (FIG. 3C). Finally, the wafer 11 is cut into chips to obtain individual semiconductor devices 1 (FIG. 2D).

As an encapsulating material, a composition comprising a resin component and a filler is used, As used herein, the "resin component" means an organic material which is typically based on an epoxy resin and which includes a curing agent to cure the base resin, a catalyst to accelerate a curing reaction, and the others. As the base resin, for example, a resin having a high thermal resistance, such as a polyimide resin, may be used. Also as used herein, the "filler" means a material of, in general, inorganic matter which is incorporated in a composition to bring a coefficient of linear expansion of an encapsulating material close to that of an semiconductor element to prevent the encapsulating material from being peeled from the element due to a difference between the coefficients of thermal expansion of the encapsulating material and the element, or to reinforce the encapsulating material. In the encapsulating material for the semiconductor device of the invention, fused silica corresponds to such a filler.

In the resin component of the encapsulating material in the semiconductor device of the invention, an epoxy resin is used as a base resin. The epoxy resin is not limited to particular one, and may be any epoxy resin provided that it has two or more epoxy groups in a molecule. The epoxy resins which can be used in the invention includes, for example, epoxy resins of cresol novolak type, epoxy resins of phenolic novolak type, biphenyl epoxy resins, naphthalene epoxy resins, various novolak epoxy resins synthesized from bisphenol A or resorcin, linear aliphatic epoxy resins, cycloaliphatic epoxy resins, heterocyclic epoxy resins, halogenated epoxy resins and the like. A combination of two or more epoxy resins may be used.

Particularly preferred epoxy resin is a biphenyl epoxy resin in view of thermal resistance and moisture resistance. In this sense, when two or more epoxy resins are used in combination for some applications, it is advantageous that the biphenyl epoxy resin is in a ratio of not less than 50% by weight of a total amounts of epoxy resins.

The encapsulating material in the invention contains, in general, a curing agent, which is also regarded as a resin component. The curing agent is not limited to particular one, and may be any curing agent provided that it reacts with an epoxy resin to cure it. Examples of the curing agent include, for example, phenolic novolak resins, cresol novolak resins, phenolic aralkyl resins, various novolak resins synthesized from trishydroxyphenylmethane, bisphenol A or resorcin, various polyhydric phenol compounds such as polyallylphenols, dicyclopentadiene phenol, resols and polyvinylphenols, acid anhydrides such as maleic anhydride, phthalic anhydride and pyromellitic anhydride, and aromatic amines such as m-phenylenediamine, diaminodiphenylmethane and diaminodiphenyl sulfone, and the like. Among others, a phenolic compound having two or more hydroxyl groups in a molecule is preferred in view of adhesion, and particularly, phenolic novolak resins, phenolic aralkyl resins and the like are preferred. In some cases, a combination of two or more curing agents is also possible.

As to a ratio of an epoxy resin to a curing agent used, although there is no particular limitation, it is preferred that a ratio of chemical equivalent of an epoxy resin to chemical equivalent of a curing agent is in the range of 0.5 to 1.5, particularly 0.8 to 1.2, in view of mechanical properties of a resultant cured product of the epoxy resin and adhesion of the cured product to a semiconductor device.

In the encapsulating material for a semiconductor device of the invention, a curing catalyst may be used to accelerate a curing reaction of an epoxy resin and a curing agent? the curing catalyst being also regarded as a resin component. The curing catalyst is not limited to particular one provided that it accelerates the curing reaction. Curing catalysts which may be used include, for example, imidazole compounds such as 2-methylimidazole, 2,4-dimethylimidazole, 2-methyl-4-methylimidazole and 2-heptadecylimidazole, tertiary amine compounds such as triethylamine, benzyldimethylamine, alphamethylbenzyldimethylamine, 2-(dimethylaminomethyl)phenol, 2,4,6-trio(dimethylaminomethyl)phenol, 1,8-diazabicyclo(5,4,0)undecene-7 and 1,5diazabicyclo(4,3,0)nonene-5, organic metal compounds such as zirconium tetramethoxide, zirconium tetrapropoxide, tetrakis(acetylacetonato) zirconium and tri(acetylacetonato) aluminum, and organic phosphine compounds such as triphenylphosphine, trimethylphosphine, triethylphosphine r tributylphosphine, tri (p-methylphenyl) phosphine, tri (nonylphenyl) phosphine, triphenylphosphine triphenylborane and tetraphenylphosphcnium tetraphenylborate, and the like. Among others, triphenylphosphine, tetraphenylphosphoniur tetraphenylborate, 1,8-diazabicyclo(5,4,0)undecene-7 and the like are particularly preferred in view of their reactivity. In some applications, a combination of two or more of curing catalysts may be used. it is preferred that a curing catalyst is used in the range of 0.1 to 10 parts by weight per 100 parts by weight of epoxy resin.

The encapsulating material for semiconductor device of the invention contains, as a filler, a fused silica in an amount of greater than 70% by weight and no greater than 90% by weight of the total weight of the encapsulating material. It has been found that a fused silica contains less impurities compared with alumina and the like, and is useful for improvement of moisture resistance of the encapsulating material. In addition, it has been also found that, by use of a filler content of greater than 70% by weight, a difference in coefficient of linear expansion between a silicon substrate (a silicon chip) and an encapsulating material can be decreased, to thereby improve the thermal cycle properties of a semiconductor device and prevent failure of bumps. In an filler content of greater than 90% by weight, flowability of an encapsulating material during encapsulation is reduced, and unfilled portions appear in a formed encapsulating material layer to give rise to pin holes at the surface of the encapsulating material layer and to reduce reliability of a semiconductor device. A warp of a wafer which occurs with increase in content of fused silica can be avoided by adapting a manufacturing process to the warp.

It is preferable for a fused silica to have an average particle diameter of 1 to 50 micrometers. In an average particle diameter of greater than 50 micrometers, wirings and bumps on an element can be damaged. In an average particle diameter of less than 1 micrometers, flowability of an encapsulating material during encapsulation can be degraded. Although the fused silica can be in any form, it is preferred that the fused silica is in the form of sphere. It is preferred that the fused silica used in the invention has a particle size distribution satisfying the following relation when the particle diameter distribution is represented by percentage of cumulative number of particles smaller than a particular particle diameter relative to total number of particles:

$$D_{10} \geq (1/10) \times D_{30}$$

$$D_{90} \leq 10 \times D_{50}$$

wherein $D_{10}$, $D_{50}$, and $D_{90}$ are particle diameters when the cumulative number of particles are 10%, 50%, and 90%, respectively.

The fused silica may or may not be surface-treated by a silane coupling agent. A fused silica has a very small amount of hydroxyl groups on its surface, and consequently, when the fused silica is surface-treated by a silane coupling agent, the unreacted silane coupling agent is prone to remain in an encapsulating material. The unreacted silane coupling agent remaining in the encapsulating material will react with moisture in the atmosphere to generate an alcohol. The alcohol will vaporize during curing of the encapsulating material, and consequently cause voids to appear in a cured product (i.e., an encapsulating material layer). There is also a case where the unreacted silane coupling agent remains in a formed encapsulating material layer, when a semiconductor device having the remaining unreacted silane coupling agent absorbs moisture, generation of alcohol due to a reaction of the absorbed moisture with the coupling agent causes reliability of the semiconductor device to be significantly reduced. This problem can be solved by coating a filler with a silane coupling agent previously subjected to a hydrolysis treatment. The previous hydrolysis treatment of silane coupling agent can be readily achieved by, for example, reacting the silane coupling agent with water.

The encapsulating material in the semiconductor device of the invention is preferred to have a melt viscosity of not greater than 300 poise (30 Pa·s) at 170° C., and a gelation time of 30 seconds or longer.

The encapsulating material in the semiconductor device of the invention may contain, as a stress lowering agent, an elastomer such as a silicone rubber, an olefinic copolymer, a modified nitrite rubber, a modified polybutadiene rubber and a modified silicone oil, a thermoplastic resin such as polyethylene, as desired. Such a stress lowering agent is useful to lower a modulus in flexure of a formed encapsulating material layer at room temperature.

Further, a halogen compound such as a halogenated epoxy resin, a flame retardant such as a phosphorus compound, a flame retarding aid such as antimony trioxide, a crosslinking agent such as an organic peroxide, and a coloring agent such as carbon black, may be optionally added to an encapsulating material.

When an encapsulating material contains an optional additive other than the resin component described before, such as those having been just referred to in the preceding paragraphs, the solvent capable of dissolving a resin component is required to be capable of also dissolving such an additive.

The encapsulating material comprising a resin component and a filler is supplied, in general, in the form of powder or tablet, for encapsulation of a semiconductor device. The semiconductor device of the invention can be produced by preparing a nonencapsulated wafer, placing an encapsulating material thereon, inserting the wafer with the encapsulating material between heated mold halves for compression molding to make an encapsulated wafer, and then cutting the wafer into individual chips. The compression molding is carried out, for example, at a temperature of 120 to 250° C., preferably 150 to 200° C. For encapsulation of a wafer, a process such as transfer molding, injection molding, or casting may also be used. After the encapsulation, an additional heat treatment (postcure) may be carried out, for example, at 150 to 180° C. for 2 to 16 hours, as required.

In the course of preparation of an encapsulating material, melting and kneading of a resin component, and subsequent solidification and grinding are essential, and it is inevitable that a metal is incorporated into the encapsulating material from items of equipment used during these processes. The semiconductor device of the invention is capable of having wirings on the surface of an element which have a distance from each other of, for example, the order of 25 to 10 micrometers, and in this case, if a metal piece having a length of, for example, 34 micrometers is included in an encapsulating material, a possibility of the included metal piece causing a short-circuit between the wirings is drastically increased. Consequently, in the encapsulating material for the semiconductor device of the inventions it is preferable that the length of included metal powder is controlled to be less than 34 micrometers, more preferably not greater than 14 micrometers, particularly not greater than 10 micrometers. By controlling the length to be not greater than 14 micrometers, reduction in yield of products due to short-circuit between wirings can be restrained. Reduction in yield of products due to short-circuit between wirings is at an acceptable level even in the case of the length of metal powder of 10 micrometers or longer and less than 34 micrometers, but in the case of 34 micrometers or longer, yield is extremely reduced, and mass-productivity is reduced. It is preferable that a total amount of metals is 150 ppm or less.

Thus, it is important that an encapsulating material for encapsulating the semiconductor device of the invention contains a strictly controlled amount of metal, and for this sake, it is required to accurately perform isolation (separation) and analysis of the metal. A method useful for isolating the metal in this case is a method in which a composition comprising a resin component and a fused silica filler is added to a solvent capable of dissolving the resin component to thereby dissolve the resin component, solvent-insolubles are then separated from the solution in which the resin component has been dissolved, the insolubles are subsequently introduced into a liquid having a specific gravity of 2.5 to 5.5 to disperse the insolubles, and the precipitate is recovered.

The solvents for dissolving a resin component include, but are not limited to, acetone, tetrahydrofuran, dimethylformamide, toluene, xylene and the like. The solvent may dissolve a material other than the resin component unless the dissolved material adversely affects the method of the invention. For the separation of insolubles from a solution in which a resin component is dissolved, a centrifuge can be used, and other means may also be used. The "insoluble" as used herein means a solid left behind after the dissolution of the resin component contained in an encapsulating material, and is a mixture of silica of filler and metals. This mixture can be separated by introducing it in a liquid having a specific gravity of 2.5 to 5.5. This makes use of a difference between the specific gravity of silica (2.1) and a specific gravity of metals, which is dependent on a type of metal material used in an item of equipment of a source of metal used in an encapsulation process, and is, in general, of the order of 6.6. The liquids used herein include, but are not limited to, diiodomethane (specific gravity 3.3), bromoform (specific gravity 2.82), a mixed liquid of potassium iodide and mercury iodide (specific gravity 3.11), a mixed liquid of barium iodide and mercury (II) iodide (specific gravity 3.56), and a saturated aqueous solution of mixture of equivalent amounts of thallium (I) malonate and thallium (I) formate (specific gravity 3.4).

By measuring sizes of separated metal powders by a scanning electron microscope (SEM), electron probe microanalysis (EPMA), optical microscope, particle image analyzing apparatus of a flow type (manufactured by Toa Medical Electronics (Toa Iyou Denshi)) or the like, metals in an encapsulating material can be readily controlled. Also, a total amount of metals can be known by weighing the metals obtained by isolation.

In an encapsulating material for semiconductor devices, synthetic silica, crystalline silica, calcium carbonate, magnesium carbonate, alumina, magnesia, clay, talc, calcium silicate, titanium oxide, antimony oxide, asbestos, glass fibers and the like are used, in addition to fused silica. The method of isolation referred to above can be also applied to an encapsulating material comprising any filler other than fused silica. Namely, metals included in an encapsulating material comprising any filler can be easily isolated by adding an encapsulating material comprising a resin component and a filler to a solvent capable of dissolving the resin component, separating the solvent-insolubles from the solution in which the resin component has been dissolved, introducing the insolubles into a liquid having a specific gravity of between a specific gravity of the filler and a specific gravity of the metal to disperse the insolubles, and then recovering precipitate.

EXAMPLES

Examples of the invention will now be described. Of course, the invention is not limited to these examples.

An encapsulating material was prepared by mixing in a mixer a biphenyl epoxy resin as a base resin (YX-4000H manufactured by Yuka Shell Epoxy), xylylene phenol as a curing agent (XLC-22511 manufactured by Mitsui Toatsu Chemicals), a flexibilizer (Crayton G-1901x manufactured by Shell Chemical), fused silica (FB-6S manufactured by Denki Kagaku Kogyc), and triphenylphosphine (curing agent) in the composition ratio shown in Table 1, subsequently melting and kneading the mixture in a kneader, followed by cooling and grinding, and then removing metals using a 10 kG magnet bar. For a fused silica treated by a silane coupling agent, gamma-glycidoxytrimethoxy silane was used as a silane coupling agent. When the silane coupling agent was treated by hydrolysis in advance, the coupling agent was mixed with water, and the mixture was then left to stand for 24 hours. In any case, the coupling agent was used in an amount of 1 part by weight per 100 parts by weight of silica.

TABLE 1

| Materials | Composition Ratio (parts by weight) |
|---|---|
| biphenyl epoxy resin | 100 |
| p-xylylenephenol | 94.1 |
| flexibilizer | 5 |
| triphenylphosphine | 1.6 |

Semiconductor devices of the type shown in FIG. 1 were produced from a wafer encapsulated by a hot press process using the prepared encapsulating material. The wafer used had a diameter of 8 inches (about 20 centimeters), and the semiconductor device was of a size of 6×7 millimeters, the semiconductor device being provided with 48 bumps having a diameter of 150 micrometers and an encapsulating material layer having a thickness of 100 micrometer, and having wirings at a distance of 10 micrometers. The following tests were carried out for the semiconductor device.

(1) Moisture Resistance

Failure of an element when a semiconductor device was left to stand in a pressure cooker tester (PCT) (121° C., 85% relative humidity) for 100 hours, and a bias voltage of 7 volts was applied to the device, was checked. Results are shown in number of semiconductor devices in which failure of element was observed per 20 semiconductor devices subjected to the test.

(2) Anti-crack Behavior of Moisture-absorbed Device Mounted on Substrate

With a semiconductor device having absorbed moisture at 85° C. and 85% relative humidity for 96 hours, presence of cracks in the encapsulating material layer of the device after mounted on a substrate by solder-reflowing in an infrared electric furnace at 245° C. was observed by a stereoscopic microscope.

(3) Voids

Presence of voids in an encapsulating layer of semiconductor device was observed by an ultrasonic law-detecting microscope.

(4) Adhesion Between Silicon Element and Encapsulating Material Layer

A semiconductor device was subjected to a cold-hot thermal shock test between −65° C. and 150° C., and presence of peeling was observed (1000 cycle peeling). Results are shown in number of semiconductor devices suffering peeling per 20 semiconductor devices subjected to the test.

(5) Open Failure of Element

A semiconductor device mounted on a glass epoxy substrate was subjected to a temperature cycle test (−50° C. to 150° C.), and presence of open failure (1000 cycle open failure) was evaluated. Results are shown in number of semiconductor devices suffering open failure (disconnection) per 20 semiconductor devices subjected to the test.

(6) Melt Viscosity and Gelation Time

A melt viscosity of each encapsulating material was determined by flow tester.

A gelation time of each encapsulating material was a time determined by placing 1 gram of ground sample on a hot plate at 170° C., simultaneously with which a stopwatch was started, stirring the sample by a metallic spatula while pressing the sample to the hot plate to melt it, and stopping the stopwatch at the time of the melted sample being gelled (solidified).

(7) Content and Maximum Length of Metal

Metals contained in an encapsulating material were isolated and analyzed by the following procedure.

200 grams of encapsulating material was dissolved and dispersed in acetone, solvent-insolubles were then centrifuged, and the solvent-insolubles were dispersed in diiodomethane to recover metals as a precipitate. The recovered metals were weighed (total metal), and a maximum length was determined by a scanning electron microscopy (SEM).

The test results are summarized in Table 2 along with added amounts of filler (ratios of filler relative to the total amount of encapsulating material).

TABLE 2

| | Examples | | | | Comparative example | | | | |
|---|---|---|---|---|---|---|---|---|---|
| | 1 | 2 | 3 | 4 | A | B | C | D | E |
| Amount of filler added, wt % | 71 | 80 | 90 | 80 | 65 | 95 | 80 | 80 | 70 |
| Treatment by gamma-glycidoxytrimethoxysilane | No | No | No | No | No | No | Yes | No | No |
| Treatment by hydrolyzed gamma-glycidoxytrimethoxysilane | No | No | No | Yes | No | No | No | No | No |
| Moisture resistance, PCT 1000 h | 1/20 | 1/20 | 1/20 | 0/20 | 10/20 | 5/20 | 20/20 | 20/20 | 2/20 |
| Anti-crank behavior | Good | Good | Good | Good | Good | Poor | Good | Good | Good |
| Thermal shock test, 1000 cycle peeling | 0/20 | 0/20 | 0/20 | 0/20 | 20/20 Bump damaged | 10/20 Unfilled | 5/20 | 0/20 | 0/20 |
| Thermal shock test, 1000 cycle open failure | 0/20 | 0/20 | 0/20 | 0/20 | 20/20 | 20/20 | 0/20 | 0/20 | 0/20 |
| Voids | No | No | No | No | No | Yes | No | No | No |
| Total metal, ppm | 60 | 60 | 60 | 60 | 60 | 60 | 60 | 60 | 60 |
| Max. metal length, μm | 8 | 8 | 8 | 8 | 8 | 8 | 8 | 35 | 8 |
| Melt viscosity, 170° C., P | 250 | 280 | 300 | 250 | 200 | 350 | 250 | 280 | 250 |
| Gelation time, 170° C., sec. | 50 | 40 | 35 | 40 | 40 | 25 | 50 | 40 | 50 |

Thus, according to the invention, the reliability of a semiconductor device, which is obtained by cutting a wafer encapsulated by an encapsulating material layer in such a mariner that each of end faces of bumps for an external terminal is exposed, can be enhanced.

The invention also makes possible to control metals included in an encapsulating material indispensable for the manufacture of semiconductor devices of high reliability.

What is claimed is:

1. A semiconductor device comprising a semiconductor element, bumps formed on a surface thereof for external terminals, and an encapsulating material layer formed in such a manner that it covers the surface of the semiconductor element on which the bumps are formed and exposes end faces of the bumps, wherein the encapsulating material layer is formed of an encapsulating material containing greater than 70% by weight and not greater than 90% by weight of fused silica, based on the total weight of the encapsulating material.

2. The semiconductor device of claim 1, wherein the encapsulating material comprises an epoxy resin.

3. The semiconductor device of claim 2, wherein the epoxy resin is selected from the group consisting of epoxy resins of cresol novolak type, epoxy resins of phenolic novolak type, biphenyl epoxy resins, naphthalene epoxy resins, novolak epoxy resins synthesized from one of bisphenol A and resorcin, linear aliphatic epoxy resins, cycloaliphatic epoxy resins, heterocyclic epoxy resins, and halogenated epoxy resins.

4. The semiconductor device of claim 2, wherein the epoxy resin is a biphenyl epoxy resin.

5. The semiconductor device of claim 2, wherein the encapsulating material comprises a mixture of two or more epoxy resins, and the mixture contains 50% by weight or more of biphenyl epoxy resin based on the total amount of the epoxy resins in the mixture.

6. The semiconductor device of claim 2, wherein the encapsulating material further comprises a curing agent to cure the epoxy resin.

7. The semiconductor device of claim 6, wherein the curing agent is selected from the group consisting of phenolic novolak resins, cresol novolak resins, phenolic aralkyl resins, novolak resins synthesized from one of trishydroxyphenylmethane, bisphenol A and resorcin, polyhydric phenol compounds, acid anhydrides, and aromatic amines.

8. The semiconductor device of claim 7, wherein the curing agent is a polyhydric phenol compound selected from the group consisting of polyallylphenols, dicyclopentadiene phenol, resole and polyvinylphenols.

9. The semiconductor device of claim 7, wherein the curing agent is an acid anhydride selected from the group consisting of maleic anhydride, phthalic anhydride and pyromellitic anhydride.

10. The semiconductor device of claim 7, wherein the curing agent is an aromatic amine selected from the group consisting of m-phenylenediamine, diaminodiphenylmethane and diaminodiphenyl sulfone.

11. The semiconductor device of claim 6, wherein the encapsulating material comprises the epoxy resin and the curing agent in an chemical equivalent ratio in the range of 0.5 to 1.5.

12. The semiconductor device of claim 11, wherein the chemical equivalent ratio of the epoxy resin and the curing agent is in the range of 0.8 to 1.2.

13. The semiconductor device of claim 6, wherein the encapsulating material further comprises a curing catalyst.

14. The semiconductor device of claim 13, wherein the catalyst is selected from the group consisting of imidazole compounds, tertiary amine compounds, organic metal compounds, and organic phosphine compounds.

15. The semiconductor device of claim 14, wherein the catalyst is an imidazole compound selected from the group consisting of 2-methylimidazole, 2,4-dimethylimidazole, 2-methyl-4-methylimidazole, and 2-heptadecylimidazole.

16. The semiconductor device of claim 14, wherein the catalyst is a tertiary amine compound selected from the group consisting of triethylamine, benzyldimethylamine, alpha-methylbenzyldimethylamine, 2-(dimethylaminomethyl)phenol, 2,4,6-tris(dimethylaminomethyl)phenol, 1,8-diazabicyclo(5,4,0)undecene-7, and 1,5-diazabicyclo(4,3,0)nonene-5.

17. The semiconductor device of claim 14, wherein the catalyst is an organic metal compound selected from the group consisting of zirconium tetramethoxide, zirconium tetrapropoxide, tetrakis(acetylacetonato) zirconium, and tri (acetylacetonato) aluminum.

18. The semiconductor device of claim 14, wherein the catalyst is an organic phosphine compound selected from the group consisting of triphenylphosphine, trimethylphosphine, triethylphosphine, tributylphosphine, tri(p-methylphenyl)phosphine, tri(nonylphenyl)phosphine, triphenylphosphine triphenylborane, and tetraphenylphosphonium tetraphenylborate.

19. The semiconductor device of claim 13, wherein the encapsulating material contains the catalyst in an amount of 0.1 to 10 parts by weight per 100 parts by weight of epoxy resin.

20. The semiconductor device of claim 1, wherein the fused silica has an average particle diameter of 1 to 50 micrometers.

21. The semiconductor device of claim 20, wherein the fused silica has a particle size distribution satisfying the following relation when the particle diameter distribution is represented by percentage of cumulative number of particles relative to total number of particles:

$$D_{10} \geq (1/10) \times D_{50}$$

$$D_{90} \leq 10 \times D_{50}$$

wherein $D_{10}$, $D_{50}$, and $D_{90}$ are particle diameters when the cumulative number of particles are 10%, 50%, and 90%, respectively.

22. The semiconductor device of claim 1, wherein the fused silica is coated with a silane coupling agent having been subjected to a hydrolysis treatment in advance.

23. The semiconductor device of claim 1, wherein the encapsulating material contains metal powder controlled to have a maximum length of less than 34 micrometers.

24. The semiconductor device of claim 23, wherein the metal powder has a maximum length of not greater than 14 micrometers.

25. The semiconductor device of claim 23, wherein the encapsulating material contains metal powder in a total amount of 150 ppm or less.

* * * * *